United States Patent
Bando et al.

(10) Patent No.: US 11,206,028 B2
(45) Date of Patent: Dec. 21, 2021

(54) VOLTAGE-CONTROLLED OSCILLATOR AND PLL CIRCUIT IN WHICH SAME IS USED

(71) Applicant: SOCIONEXT INC., Kanagawa (JP)

(72) Inventors: Yoji Bando, Yokohama (JP); Heiji Ikoma, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/327,358

(22) Filed: May 21, 2021

(65) Prior Publication Data
US 2021/0281266 A1    Sep. 9, 2021

Related U.S. Application Data

(63) Continuation of application No. PCT/JP2018/043241, filed on Nov. 22, 2018.

(51) Int. Cl.
*H03L 7/099* (2006.01)
*H03K 3/03* (2006.01)
*H03L 7/089* (2006.01)

(52) U.S. Cl.
CPC .......... *H03L 7/099* (2013.01); *H03K 3/0315* (2013.01); *H03L 7/0891* (2013.01)

(58) Field of Classification Search
CPC ...... H03L 7/099; H03L 7/0891; H03K 3/0315
USPC ........................................................ 327/157
See application file for complete search history.

(56) References Cited

U.S. PATENT DOCUMENTS

| | | | | |
|---|---|---|---|---|
| 5,036,216 A | * | 7/1991 | Hohmann | ............... H03L 7/187 327/157 |
| 5,245,298 A | * | 9/1993 | Pham | ................... H03B 5/1221 331/117 R |
| 5,331,295 A | * | 7/1994 | Jelinek | ...................... H03L 1/00 331/57 |
| 5,457,429 A | * | 10/1995 | Ogawa | ................... H03K 3/354 331/57 |

(Continued)

FOREIGN PATENT DOCUMENTS

| | | |
|---|---|---|
| JP | H08-88565 A | 4/1996 |
| JP | 2001-257567 A | 9/2001 |

(Continued)

OTHER PUBLICATIONS

International Search Report issued in corresponding International Patent Application No. PCT/JP2018/043241, dated Jan. 29, 2019, with English translation.

(Continued)

*Primary Examiner* — Adam D Houston
(74) *Attorney, Agent, or Firm* — McDermott Will & Emery LLP

(57) ABSTRACT

A voltage-controlled oscillator includes: a first transistor with its gate connected to an input terminal, its source connected to a first power supply, and its drain connected to a first node; a second transistor with its gate connected to a first bias voltage, its source connected to a second power supply, and its drain connected to the first node; and an inverter ring connected between the first node and the first power supply. The inverter ring is constituted by a plurality of stages of inverters connected in series, and an output of a final-stage inverter is connected to an output terminal and an input of an initial-stage inverter.

15 Claims, 9 Drawing Sheets

(56) References Cited

U.S. PATENT DOCUMENTS

| | | | |
|---|---|---|---|
| 5,463,353 A | 10/1995 | Countryman et al. | |
| 5,789,989 A * | 8/1998 | Paschal | H03K 3/354 331/177 R |
| 5,909,150 A * | 6/1999 | Kostelnik | G11B 20/1403 331/34 |
| 5,963,102 A * | 10/1999 | Pang | H03K 3/0315 331/57 |
| 5,994,968 A * | 11/1999 | Iravani | H03K 3/0231 327/157 |
| 6,011,443 A * | 1/2000 | Chen | H03K 3/03 331/175 |
| 6,184,754 B1 * | 2/2001 | Kaneko | H03K 3/354 331/57 |
| 6,687,165 B1 * | 2/2004 | Cioaca | G05F 3/245 327/158 |
| 6,768,387 B1 | 7/2004 | Masuda et al. | |
| 7,015,766 B1 * | 3/2006 | Guo | H03K 5/133 331/176 |
| 8,299,728 B2 * | 10/2012 | Nakao | G09G 3/3655 315/307 |
| 10,707,882 B1 | 7/2020 | Zhang | H03L 7/0891 |
| 2001/0041548 A1 | 11/2001 | Bult | H03F 3/45188 455/252.1 |
| 2001/0043123 A1 * | 11/2001 | Yabe | H03K 3/0231 331/34 |
| 2002/0033721 A1 * | 3/2002 | Tachimori | H03L 7/0995 327/158 |
| 2003/0071691 A1 * | 4/2003 | Boerstler | H03K 3/0315 331/57 |
| 2003/0218510 A1 * | 11/2003 | Hwang | H03K 3/011 331/57 |
| 2005/0068073 A1 * | 3/2005 | Shi | H03L 7/093 327/156 |
| 2005/0086038 A1 * | 4/2005 | Reddy | H01L 22/34 703/15 |
| 2005/0088247 A1 * | 4/2005 | Yasui | H03K 3/011 331/57 |
| 2005/0110578 A1 * | 5/2005 | Ngo | H03L 7/0997 331/16 |
| 2007/0085624 A1 * | 4/2007 | Sanchez | H03K 5/133 331/185 |
| 2009/0015319 A1 * | 1/2009 | Tzeng | H03L 7/0995 327/537 |
| 2009/0140817 A1 * | 6/2009 | Deng | H03B 5/1228 331/17 |
| 2009/0167445 A1 * | 7/2009 | Podmanik | H03K 3/0315 331/57 |
| 2010/0295626 A1 * | 11/2010 | Kim | H03B 5/1212 331/117 FE |
| 2011/0084743 A1 * | 4/2011 | Chen | H03K 3/0315 327/157 |
| 2013/0120040 A1 * | 5/2013 | Zhong | H03L 7/0893 327/157 |
| 2013/0187691 A1 | 7/2013 | Sreekiran | |
| 2014/0273883 A1 * | 9/2014 | Chakraborty | H03F 1/02 455/73 |
| 2014/0327486 A1 * | 11/2014 | Roine | H03K 3/0315 331/108 C |
| 2015/0091658 A1 | 4/2015 | Shima et al. | |
| 2015/0194928 A1 * | 7/2015 | Wang | G11C 13/0038 331/177 R |
| 2016/0301398 A1 * | 10/2016 | Shirao | H03L 7/00 |
| 2018/0267481 A1 | 9/2018 | Kondo et al. | |
| 2021/0281266 A1 * | 9/2021 | Bando | H03L 7/099 |

FOREIGN PATENT DOCUMENTS

| | | |
|---|---|---|
| JP | 2007-129501 A | 5/2007 |
| JP | 2016-208156 A | 12/2016 |
| JP | 2018-155655 A | 10/2018 |
| WO | 2014/136339 A1 | 9/2014 |

OTHER PUBLICATIONS

Written Opinion ssued in corresponding International Patent Application No. PCT/JP2018/043241, dated Jan. 29, 2019, with partial English translation.

* cited by examiner

VOLTAGE-CONTROLLED OSCILLATOR AND PLL CIRCUIT IN WHICH SAME IS USED

CROSS-REFERENCE TO RELATED APPLICATIONS

This is a continuation of International Application No. PCT/JP2018/043241 filed on Nov. 22, 2018. The entire disclosure of this application is incorporated by reference herein.

BACKGROUND

The present disclosure relates to a voltage-controlled oscillator (hereinafter also called a "VCO") and a phase locked loop (PLL) circuit using the same.

The VCO is a circuit that generates a periodical oscillating signal responsive to an input voltage, and used in a PLL circuit and the like. In recent years, with the speedup of semiconductor integrated circuits, PLL circuits are required to generate stable and high-speed clocks. To achieve this, stable and high-speed oscillation is necessary for VCOs.

Japanese Unexamined Patent Publication No. H08-88565 discloses, as a current source of a ring oscillator included in a VCO, a circuit in which a transistor with an input voltage connected to its gate and a transistor with a power supply voltage connected to its gate (a constant current source) are connected in parallel.

SUMMARY

Conventional circuits have a problem that, when the current flowing to a ring oscillator is increased to oscillate a VCO at high speed, the operation of a transistor that is to be a current source goes out of the saturated region, whereby the transistor fails to operate stably.

In consideration of the above problem, an objective of the present disclosure is providing a VCO capable of stable and high-speed oscillation.

In a mode of the present disclosure, a voltage-controlled oscillator outputs, from an output terminal, an oscillating signal responsive to an input voltage received at an input terminal. The voltage-controlled oscillator includes: a first transistor of a first conductivity type with its gate connected to the input terminal, its source connected to a first power supply, and its drain connected to a first node; a second transistor of a second conductivity type different in conductivity type from the first conductivity type, with its gate connected to a first bias voltage, its source connected to a second power supply different in potential from the first power supply, and its drain connected to the first node; and an inverter ring constituted by a plurality of stages of inverters connected in series between the first node and the first power supply, an output of a final-stage inverter being connected to the output terminal and to an input of an initial-stage inverter, and the oscillating signal being output from the output terminal.

In order to ensure that the voltage-controlled oscillator oscillates stably at high speed, the current flowing to the inverter ring is required to be large and not to fluctuate. In the configuration of the above mode, therefore, it is desired that the current flowing to the inverter ring be relatively large and also the first transistor and the second transistor operate in the saturated region.

In the configuration of this mode, when the current flowing to the inverter ring is increased, the voltage between the firsts node and the first power supply (the voltage applied between power supplies for the ring oscillator) rises. At this time, the drain-source voltage of the first transistor connected between the first node and the first power supply also rises. Therefore, the first transistor can be operated more stably in the saturated region. Also, since the bias voltage is applied to the gate of the second transistor, the second transistor can be operated in the saturated region even when the voltage between the first node and the second power supply rises. Thus, the ring oscillator can be oscillated stably at a high frequency, and in turn the voltage-controlled oscillator can be oscillated stably at a high frequency.

According to the present disclosure, a voltage-controlled oscillator (VCO) capable of stable and high-speed oscillation can be provided.

DETAILED DESCRIPTION

An embodiment of the present disclosure will be described hereinafter with reference to the accompanying drawings.

—Configuration of PLL Circuit—

Figure 1:
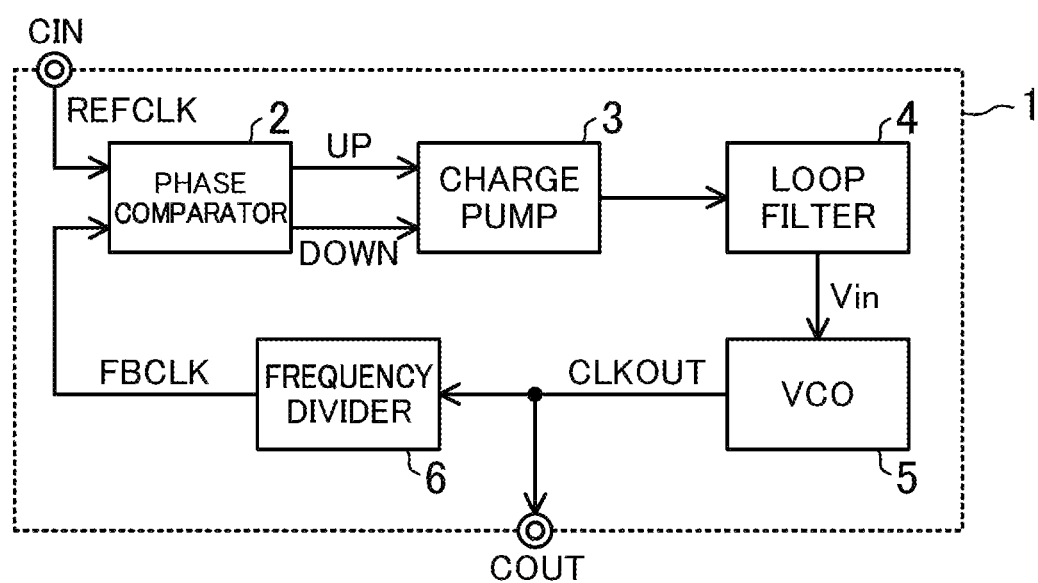
FIG. 1 is a block diagram showing a configuration of a PLL circuit of an embodiment.

As shown in FIG. 1, a PLL circuit 1 includes a phase comparator 2, a charge pump circuit 3, a loop filter 4, a VCO 5, and a frequency divider 6.

The phase comparator 2 receives an external clock signal REFCLK as a reference clock input into an input terminal CIN from outside and a feedback clock signal FBCLK output from the frequency divider 6. The phase comparator 2 compares the phases of the clock signals REFCLK and FBCLK and, based on the comparison result, activates one of an UP signal and a DOWN signal to be output to the charge pump circuit 3.

The charge pump circuit 3, receiving the UP signal and the DOWN signal from the phase comparator 2, performs charge pumping.

The loop filter 4, receiving an output signal from the charge pump circuit 3, converts the signal to a control voltage Vin for controlling the VCO 5 and outputs the voltage to the VCO 5.

The VCO 5, receiving the control voltage Vin (equivalent to the input voltage) from the loop filter 4 via an input terminal PIN, oscillates at a frequency responsive to the control voltage Vin and outputs an output clock signal CLKOUT (equivalent to the oscillating signal) from an output terminal POUT. The output clock signal CLKOUT is output outside the PLL circuit 1 via an output terminal COUT of the PLL circuit 1. The technology of the present disclosure is characterized by the configuration of the VCO 5, which will be described in detail later.

The frequency divider 6, receiving the output clock signal CLKOUT from the VCO 5, divides the frequency of the clock at a division ratio set arbitrarily and outputs the result as the feedback clock signal FBCLK.

—Configuration of VCO—

Figure 2:
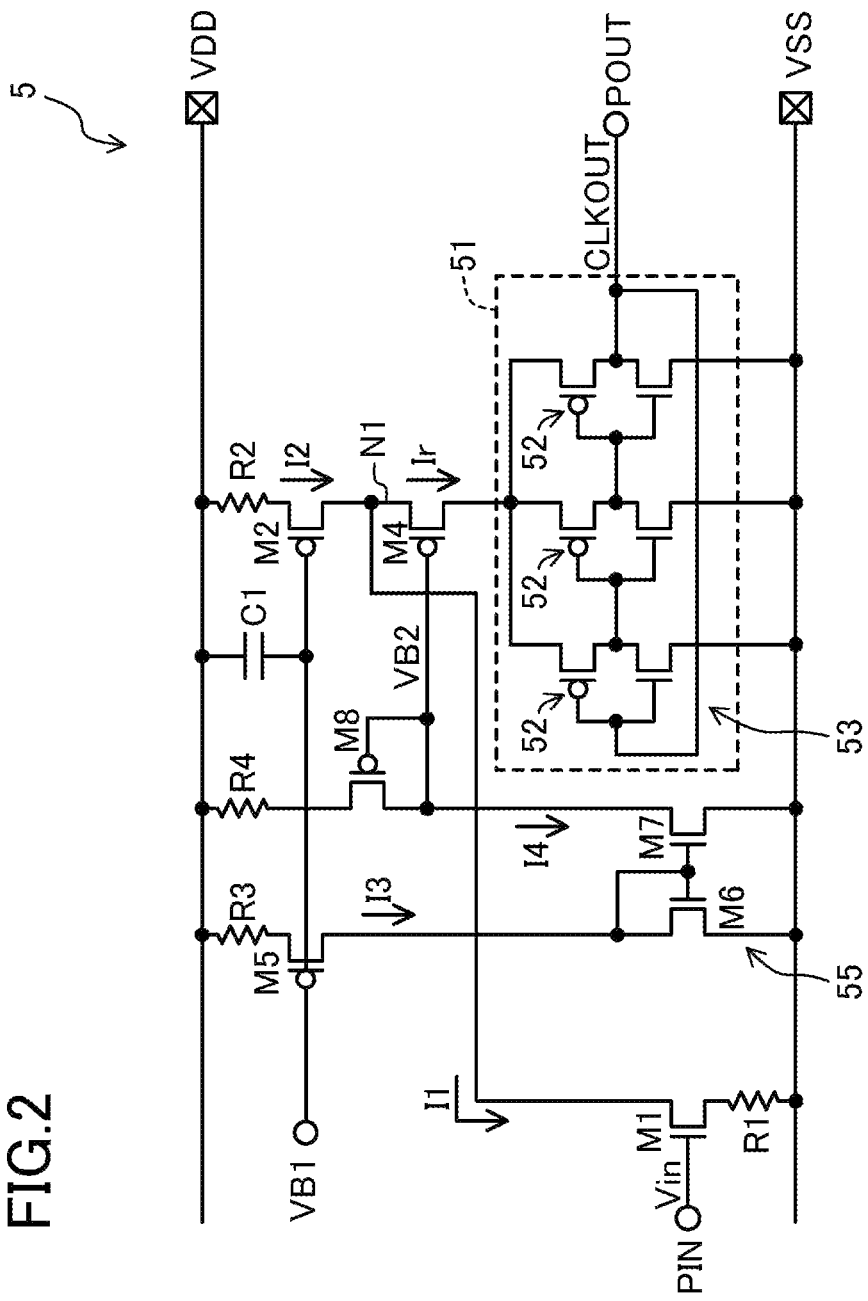
FIG. 2 is a view showing a circuit configuration example of a voltage-controlled oscillator (VCO) of the embodiment.

FIG. 2 is a view showing a circuit configuration example of the voltage-controlled oscillator (VCO) of this embodiment.

The VCO 5 includes the input terminal PIN into which the control voltage Vin is input, an n-type (equivalent to the first conductivity type) first transistor M1 the gate of which is connected to the input terminal PIN, a p-type (equivalent to the second conductivity type) second transistor M2, and a ring oscillator 51.

The source of the first transistor M1 is connected to a ground VSS (equivalent to the first power supply) and the drain thereof is connected to a first node N1. Note that, as used herein, the wording "connected" is a broadly covering concept of being electrically connected, including, not only being connected directly, but also being electrically connected indirectly via a passive element, etc. For example, the wording "the source of the first transistor M1 is connected to a ground" includes the case of the source of the first transistor M1 being connected to a ground VSS via a resistive element R1 as shown in FIG. 2. The resistive element R1 may be omitted (see FIGS. 3 to 6), but, by providing the resistive element R1, flicker noise can be reduced.

The source of the second transistor M2 is connected to a power supply VDD (equivalent to the second power supply) and the drain thereof is connected to the first node N1. The gate of the second transistor M2 is connected to a predetermined first bias voltage VB1. In FIG. 2, the source of the second transistor M2 is connected to the power supply VDD via a resistive element R2. As in the case of the resistive element R1, although the resistive element R2, and resistive elements R3 and R4 to be described later, may be omitted from the configuration of FIG. 2 (see FIGS. 3 to 6), flicker noise can be reduced by providing the resistive elements R2 to R4.

The ring oscillator 51 is a circuit that oscillates at a frequency responsive to (roughly proportional to) a current Ir flowing through the ring oscillator 51. FIG. 2 shows an example in which the ring oscillator 51 is constituted by an inverter ring 53 connected between the first node N1 and the ground VSS. In other words, the inverter ring 53 and the second transistor M2 are connected via the first node N1.

The inverter ring 53 is constituted by a plurality of stages (three stages in FIG. 2) of inverters 52 connected in series, where the output of the final-stage inverter 52 is connected to the output terminal POUT and the input of the initial-stage inverter 52.

The VCO 5 may include a cascode transistor M4 provided at the first node N1. In the example of FIG. 2, the VCO 5 includes the p-type cascode transistor M4 and a bias circuit 55 that applies a fixed voltage responsive to the first bias voltage VB1 to the gate of the cascode transistor M4.

The cascode transistor M4 is connected between the drain of the second transistor M2 and a positive-side power supply node of the ring oscillator 51. The drain of the first transistor M1 is connected between the drain of the second transistor M2 and the source of the cascode transistor M4.

The bias circuit 55 has a circuit configuration including a current mirror circuit, which includes two p-type transistors M5 and M8 and two n-type transistors M6 and M7. The resistive elements R3 and R4 for reduction of flicker noise are provided between the bias circuit and the power supply VDD at positions corresponding to the resistive element R2 described above.

The gate of the p-type transistor M5 is connected to the first bias voltage VB1, and the source thereof is connected to the power supply VDD via the resistive element R3. The drain of the p-type transistor M5 is connected to the drain and gate of the n-type transistor M6 and the gate of the n-type transistor M7. The source of the n-type transistor M6 is connected to the ground VSS. The source of the n-type transistor M7 is connected to the ground VSS, and the drain thereof is connected to the power supply VDD via the p-type transistor M8 and the resistive element R4. Thus, in the bias circuit 55, a current I3 responsive to the first bias voltage VB1 flows to the p-type transistor M5, and a mirror current I4 responsive to the current I3 flows to the n-type transistor M7.

The drain of the n-type transistor M7 is connected to the drain and gate of the p-type transistor M8 and the gate of the cascode transistor M4. Thus, a fixed second bias voltage VB2 responsive to the first bias voltage VB1 is applied to the gate of the cascode transistor M4.

As described above, by providing the cascode transistor M4, the cascode transistor M4 serves as a shield against voltage fluctuations at the power supply node on the positive side of the ring oscillator 51, thereby resisting propagation of such voltage fluctuations to the drain of the second transistor M2.

The VCO 5 may further include a capacitive element C1 between the power supply VDD and the gate of the second transistor M2 for reducing power supply noise and crosstalk noise superimposed on the first bias voltage VB1.

As described above, in the VCO 5 according to the present disclosure, a fixed first bias voltage VB1 is applied to the gate of the second transistor M2, to allow a constant current I2 to flow to the second transistor M2. Also, the control voltage Vin is applied to the gate of the first transistor M1, to allow a current I1 responsive to the control voltage Vin to flow to the first transistor M1. That is, in the VCO 5 according to the present disclosure, the difference current Ir obtained by subtracting the current I1 responsive to the control voltage Vin from the current flowing through the second transistor M2 (Ir=I2−I1) is allowed to flow to the ring oscillator 51 to control the oscillating frequency of the ring oscillator 51. With such a configuration, the ring oscillator 51 can be oscillated stably at a high frequency.

The stable oscillation of the ring oscillator 51 at a high frequency will be described hereinafter more specifically. The following description will be made with reference to a circuit of FIG. 3 for easy understanding. Note that, since the basic principle is the same among the configuration of FIG. 3, that of FIG. 2 and those of FIGS. 4 to 6 and 8 to be described later, there is no problem in considering the following description as the description on the VCOs 5 of FIGS. 2, 4 to 6, and 8.

Figure 3:
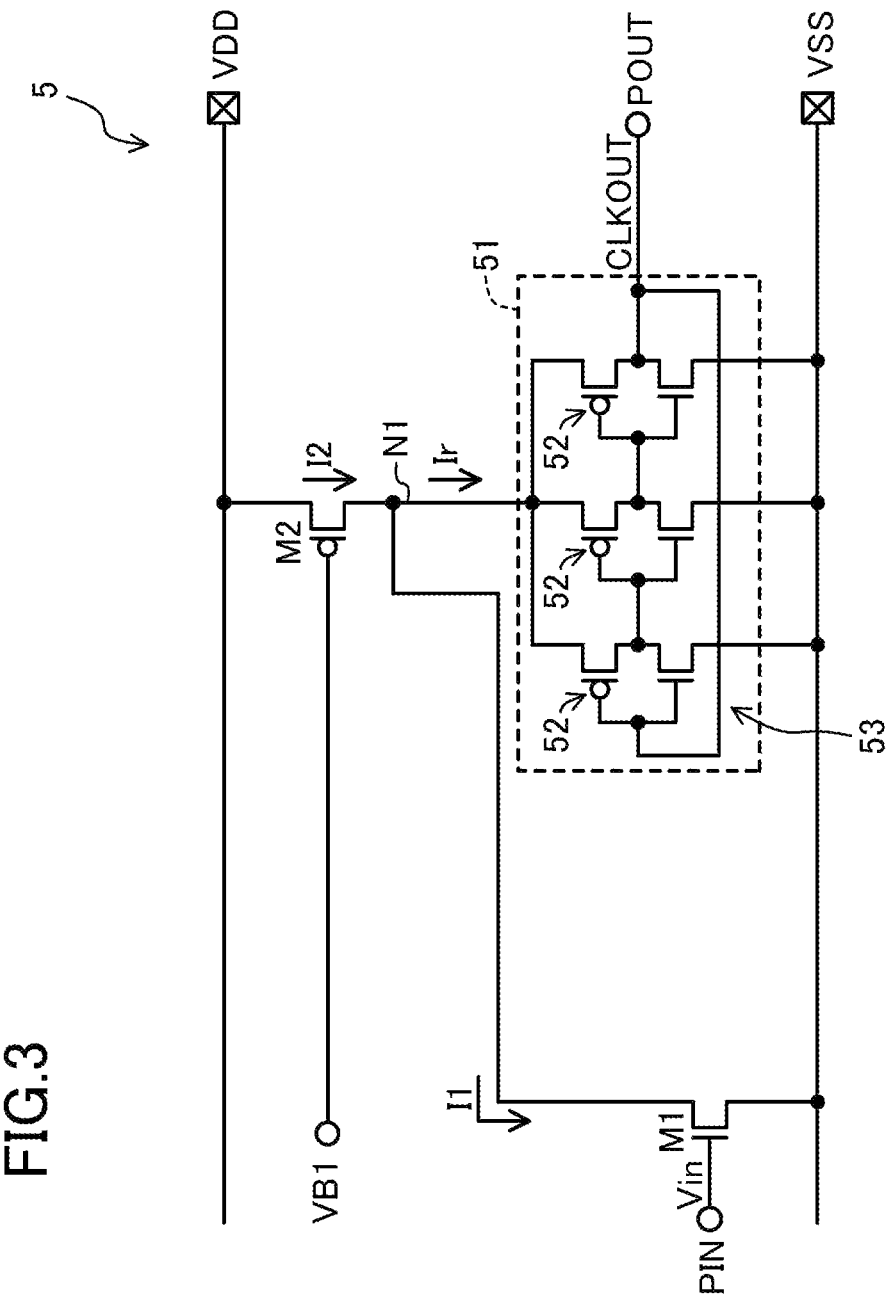
FIG. 3 is a view showing another circuit configuration example of the VCO of the embodiment.

In the configuration of FIG. 3, in comparison to the configuration of FIG. 2, the cascode transistor M4 and the bias circuit 55 are omitted. Further, the capacitive element C1 and the resistive elements R1 to R4 are omitted.

In the VCO 5 of FIG. 3, for stable oscillation of the ring oscillator 51 at a high frequency, the current Ir flowing to the ring oscillator 51 is required to be large and not to fluctuate. That is, it is desired to (A) operate the first transistor M1 in the saturated region, (B) operate the second transistor M2 in the saturated region, and yet (C) make the current Ir flowing to the ring oscillator 51 relatively large.

In general, when a transistor Ma operates in the saturated region, a current Ia flowing to the transistor Ma is represented by expression (1):

$$Ia = \frac{\beta}{2}(VGS - VTH)^2 \quad (1)$$

In order for the transistor Ma to operate in the saturated region, expression (2) below must be satisfied.

$$0 < (VGS - VTH) < VDS \quad (2)$$

In expressions (1) and (2), β is a value determined by a process constant and device dimensions, VGS is a gate-source voltage of the transistor Ma, VTH is a threshold value of the transistor Ma, and VDS is a drain-source voltage of the transistor Ma.

From expression (2), in order to operate the transistor Ma in the saturated region, (VGS−VTH) must be lower than VDS. When VDS is low, the upper limit of (VGS−VTH) is restricted. It is therefore found that, to increase the current Ia in expression (1), β must be increased.

Returning back to FIG. 3, to "(A) operate the first transistor M1 in the saturated region" will be described.

The variably-controlled control voltage Vin is applied to the gate of the first transistor M1. That is, since the control voltage Vin is sometimes low and sometimes high, a gate-source voltage VGS1 (hereinafter simply called VGS1) of the first transistor M1 can be sometimes low and sometimes high. It is therefore desirable to set a drain-source voltage VDS1 (hereinafter simply called VDS1) of the first transistor M1 at a high value so that the first transistor M1 can operate in the saturated region even when VGS1 of the first transistor M1 is high (see expression (2) above).

Next, to "(C) make the current Ir flowing to the ring oscillator 51 relatively large" and to "(B) operate the second transistor M2 in the saturated region" will be described.

When increasing the current I2 flowing to the second transistor M2 to increase the current Ir, it is advisable to set the value β of the second transistor M2 at a large value from expression (1) above.

The first bias voltage VB1 is connected to the gate of the second transistor M2. That is, a gate-source voltage VGS2 (hereinafter simply called VGS2) of the second transistor M2 is a constant voltage that can be set arbitrarily. Therefore, by setting the first bias voltage VB1 at a low value with which "(VGS2−VTH2)>0" is satisfied, the second transistor M2 can be operated in the saturated region even when the value β is made large. VTH2 is the threshold value of the second transistor M2.

As described above, with the configuration according to the present disclosure, the conditions (A) to (C) for stable oscillation of the ring oscillator 51 at a high frequency can be satisfied.

In order to enhance the oscillating frequency of the ring oscillator, it is necessary to make the current Ir flowing to the ring oscillator 51 comparatively large. With the current Ir becoming large, however, the voltage applied between the power supply node on the positive side of the ring oscillator 51 and the power supply node on the negative side thereof, that is, a voltage Vr between the first node N1 and the ground VSS also rises.

Expression (3) below represents the relationship among the voltage Vr (VDS1 of the first transistor M1), a voltage Vdd of the power supply VDD, and a drain-source voltage VDS2 (hereinafter simply called VDS2) of the second transistor M2.

$$Vr = VDS1 = Vdd - VDS2 \quad (3)$$

As described above, in order to operate the first transistor M1 in the saturated region, VDS1 of the first transistor M1 needs to be set at a high value. In the VCO 5 according to the present disclosure, in which the first transistor M1 and the ring oscillator 51 are connected in parallel, by setting VDS1 of the first transistor M1 at a high value, the voltage Vr can be simultaneously made high. Further, even when the value β of the second transistor M2 is made large to increase the current I2 flowing to the second transistor M2, the second transistor M2 can be operated in the saturated region without the necessity of raising VDS2 by adjusting the first bias voltage VB1 to a relatively low value. In this way, the voltage Vr can be made high, and in turn the current Ir can be made large. That is, according to the configuration of this embodiment, the ring oscillator 51 can be stably oscillated at a high frequency, and in turn the VCO 5 and the PLL circuit 1 can be stably oscillated at a high frequency.

Comparative Example

Figure 9:
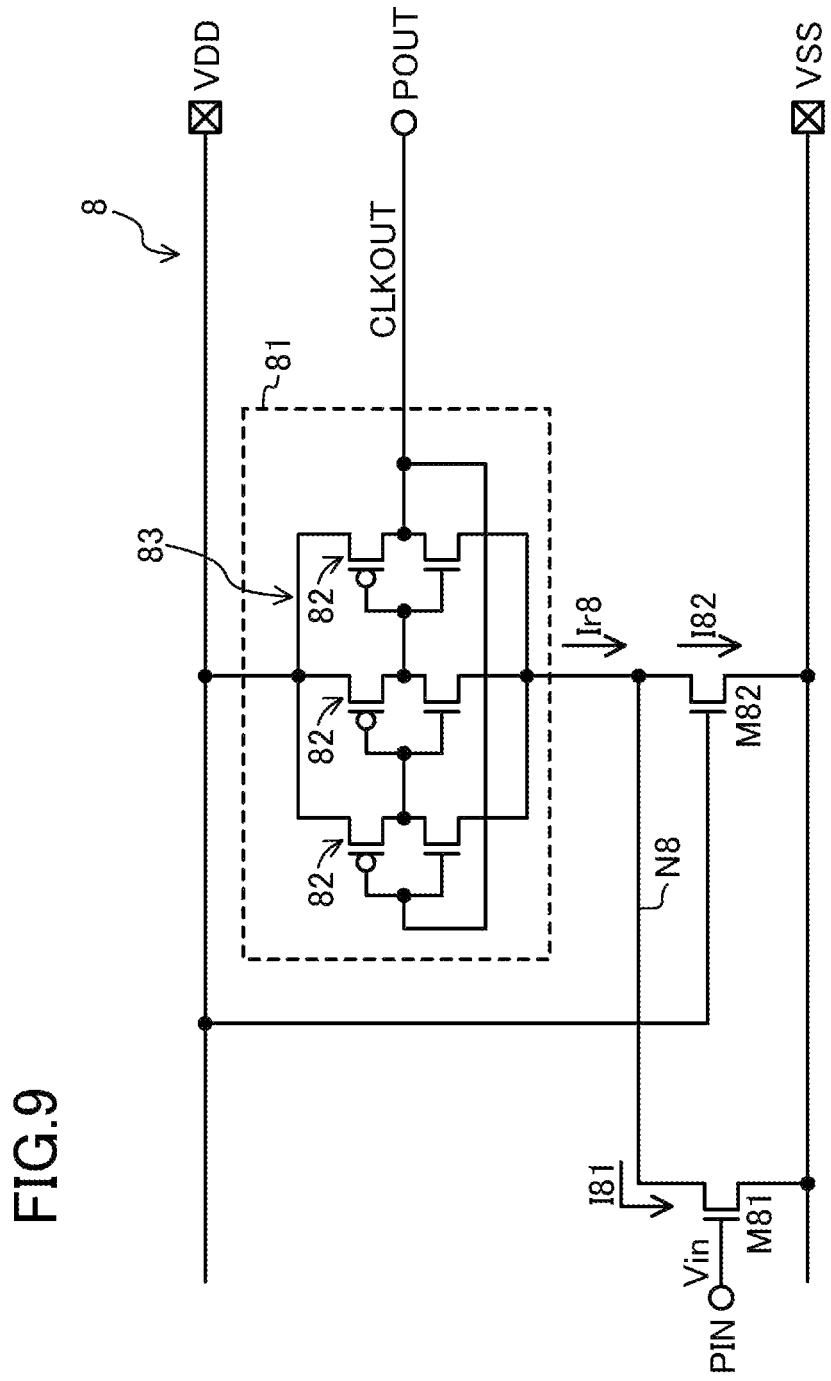
FIG. 9 is a view showing a circuit configuration example of a VCO of a comparative example.

FIG. 9 is a view showing a circuit configuration example of a voltage-controlled oscillator (VCO) of a comparative example. In the comparative example of FIG. 9, components of the cited patent document that are highly related to the present application are extracted and illustrated.

A VCO 8 of the comparative example includes an input terminal PIN into which a control voltage Vin is input, an n-type transistor M81 the gate of which is connected to the input terminal PIN, an n-type transistor M82 connected in parallel with the n-type transistor M81, and a ring oscillator 81.

The source of the n-type transistor M81 is connected to a ground VSS and the drain thereof is connected to a node N8. The source of the n-type transistor M82 is connected to the ground VSS and the drain thereof is connected to the node N8. The gate of the n-type transistor M82 is connected to a power supply VDD. The ring oscillator 81 is constituted by an inverter ring 83 made of three stages of inverters 82 and is connected between the node N8 and the power supply VDD.

In the VCO 8 of the comparative example, a power supply voltage Vdd is applied to the gate of the n-type transistor M82, thereby allowing a constant current I82 to flow to the n-type transistor M82. Also, the control voltage Vin is applied to the n-type transistor M81, thereby allowing a current I81 responsive to the control voltage Vin to flow to the n-type transistor M81.

The ring oscillator 81 oscillates at a frequency responsive to a current Ir8 flowing through the ring oscillator 81 as already described. In the VCO 8 of the comparative example, the current I81 and the constant current I82 are summed up and flows to the ring oscillator 81 as the current Ir8 (Ir8=I81+I82), and the oscillating frequency of the ring oscillator 81 is controlled with the current Ir8.

In order to oscillate the ring oscillator 81 stably at a high frequency, as in the above embodiment, the n-type transistors 81 and 82 need to be operated in the saturated region.

In the VCO 8, since the gate of the n-type transistor M82 is connected to the power supply VDD, a gate-source voltage VGS82 (hereinafter simply called VGS82) of the n-type transistor M82 is the power supply voltage Vdd. This indicates that the difference between VGS82 of the n-type transistor M82 and VTH82 (VGS82−VTH82) is high compared to the case of this embodiment. This raises a problem that, unless a drain-source voltage VDS82 (hereinafter simply called VDS82) of the n-type transistor M82 is set at a value higher than the case of this embodiment, the n-type transistor M82 cannot be operated in the saturated region. VTH82 is the threshold value of the n-type transistor M82.

Expression (4) below represents the relationship among a voltage Vr8 applied between the power supply node on the positive side of the ring oscillator 81 and the power supply node on the negative side thereof, the voltage Vdd of the power supply VDD, VDS82 of the n-type transistor M82, and a drain-source voltage VDS81 (hereinafter simply called VDS81) of the n-type transistor M81.

$$Vr8=Vdd-VDS82=Vdd-VDS81 \qquad (4)$$

As described above, in order to operate the n-type transistor M82 in the saturated region, VDS82 of the n-type transistor M82 needs to be relatively high. From the relationship in expression (4), however, as VDS82 of the n-type transistor M82 is higher, the voltage Vr8 becomes lower.

Therefore, in the comparative example, in comparison to the embodiment, it is difficult to increase the current Ir8 flowing to the ring oscillator 81.

As described above, the VCO 5 of this embodiment includes: the first transistor M1 with the gate connected to the input terminal PIN, the source connected to the ground VSS, and the drain connected to the first node N1; the second transistor M2 with the gate connected to the first bias voltage VB1, the source connected to the power supply VDD, and the drain connected to the first node N1; and the ring oscillator 51 provided between the first node N1 and the ground VSS.

In other words, in the VCO 5 of this embodiment, the first transistor M1 and the ring oscillator 51 are connected in parallel. Also, the second transistor M2 and the ring oscillator 51 are connected in series between the power supply VDD and the ground VSS with the second transistor M2 being closer to the power supply VDD. That is, the VCO 5 is configured so that, when the current Ir flowing to the ring oscillator 51 is increased, VDS1 of the first transistor M1 also rises, whereby the first transistor M1 can be operated more stably in the saturated region. Also, since the bias voltage is applied to the gate of the second transistor M2, the second transistor M2 can be operated in the saturated region even when the voltage Vr rises with the increase of the current Ir. Thus, the ring oscillator 51 can be oscillated stably at a high frequency, and in turn the VCO 5 can be oscillated stably at a high frequency.

Figure 4:
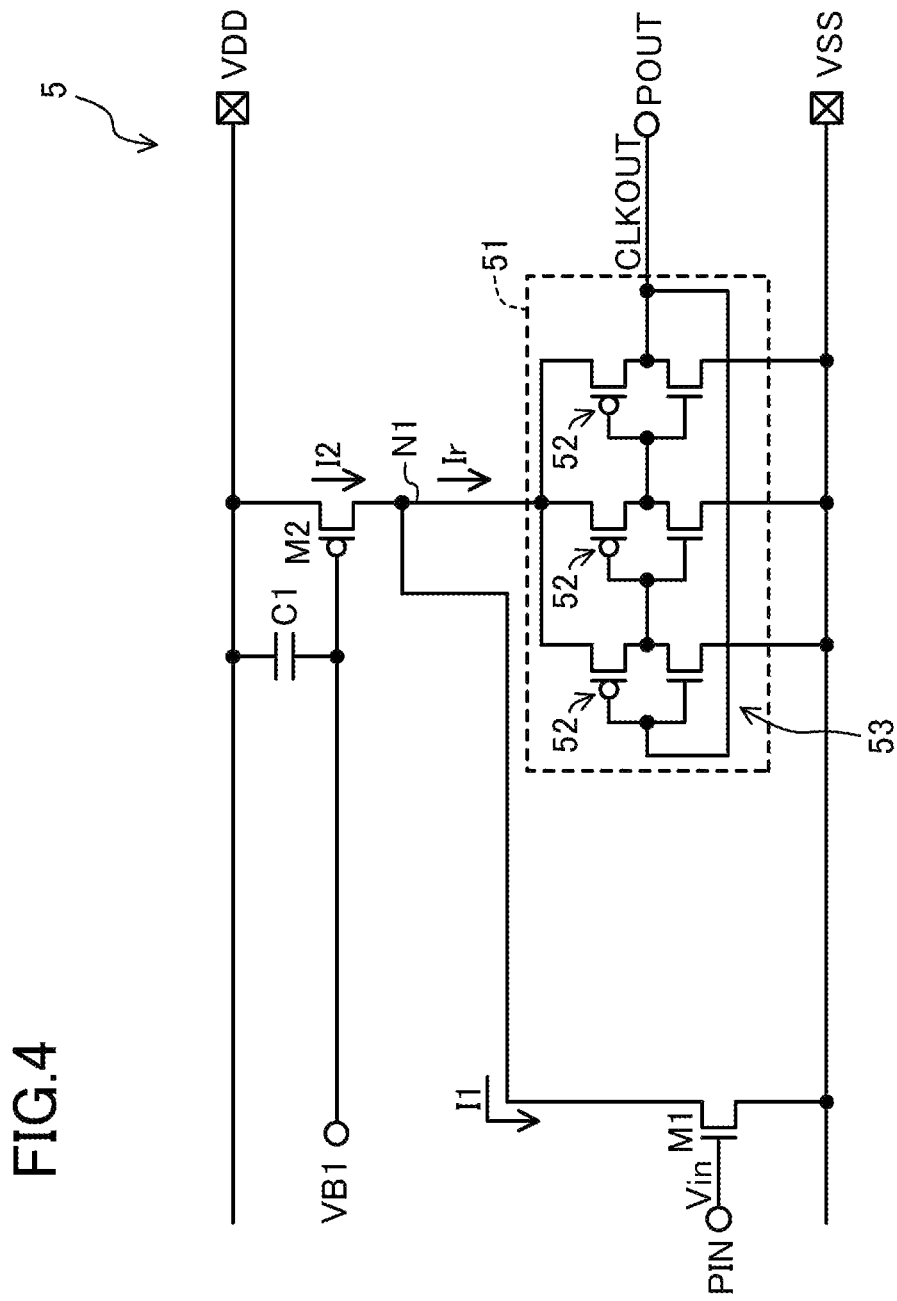
FIG. 4 is a view showing yet another circuit configuration example of the VCO of the embodiment.

The VCO 5 may include the capacitive element C1 connected between the power supply VDD and the gate of the second transistor M2. FIG. 4 shows an example in which the capacitive element C1 is added to the circuit configuration of FIG. 3. The capacitive element C1 serves to keep VGS2 of the second transistor M2 constant, so that fluctuations of the constant current I2 flowing to the second transistor M2 can be reduced. Thus, fluctuations of the current Ir flowing to the inverter ring 53 can be reduced, and then fluctuations of the oscillating frequency of the VCO 5 can be reduced.

Figure 5:
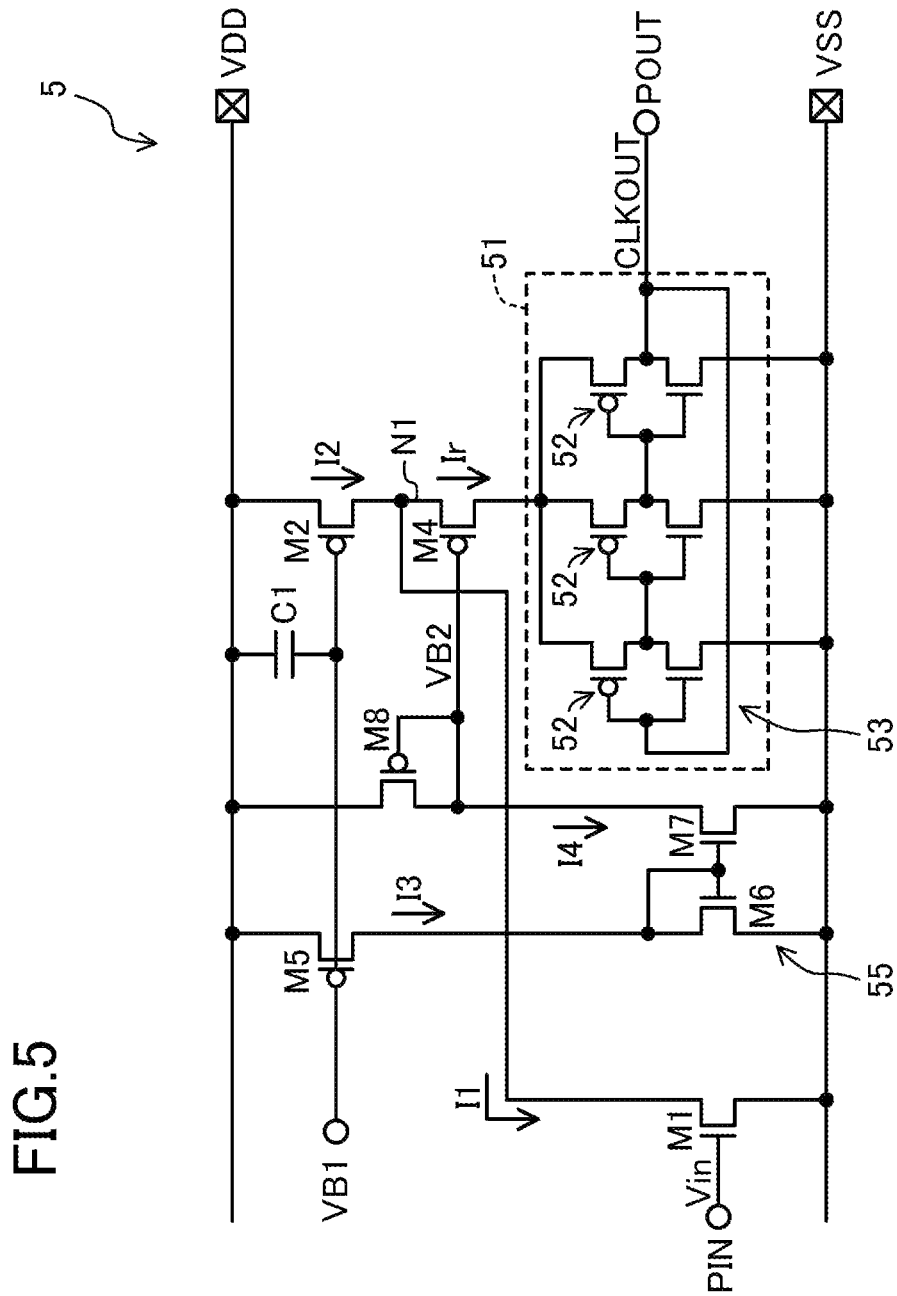
FIG. 5 is a view showing yet another circuit configuration example of the VCO of the embodiment.

The VCO 5 may include the cascode transistor M4 connected between the second transistor M2 and the inverter ring 53. In this case, the second bias voltage VB2 responsive to the first bias voltage VB1 is connected to the gate of the cascode transistor M4. FIG. 5 shows an example in which the cascode transistor M4 is added to the circuit configuration of FIG. 4. With this configuration, the cascode transistor M4 functions as a shield against voltage fluctuations at the power supply node on the positive side of the inverter ring 53, thereby resisting propagation of such voltage fluctuations to the drain of the second transistor M2. This reduces fluctuations of VDS2 of the second transistor M2. Thus, fluctuations of the current Ir is also reduced, and then fluctuations of the oscillating frequency of the VCO 5 can be reduced.

Figure 6:
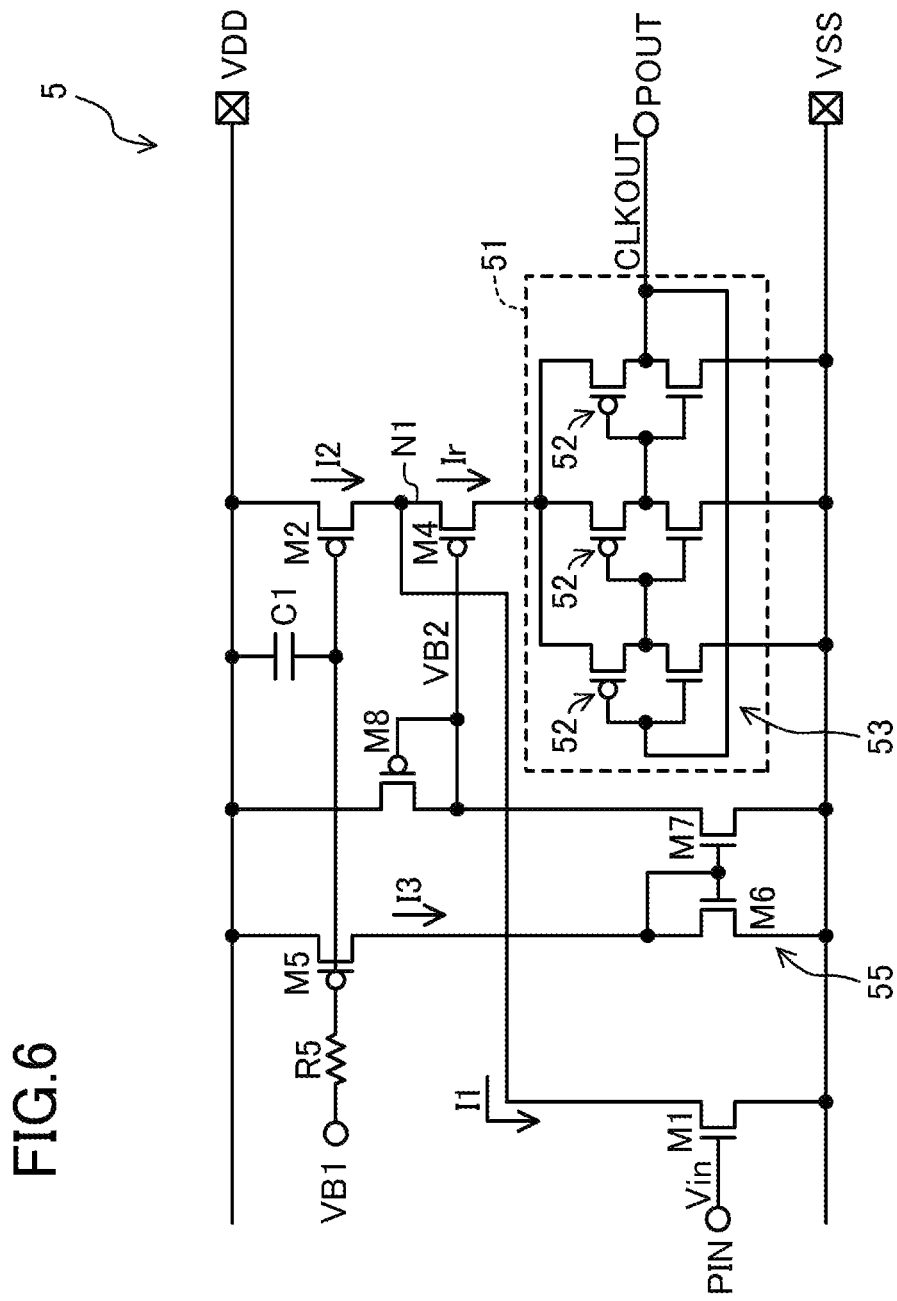
FIG. 6 is a view showing yet another circuit configuration example of the VCO of the embodiment.

In the VCO 5, a resistive element R5 (equivalent to the third resistive element) may be connected between the second transistor M2 and the first bias voltage VB1, to constitute a RC filter circuit by the resistive element R5 and the capacitive element C1. FIG. 6 shows an example in which the resistive element R5 is added to the circuit configuration of FIG. 5. With this, heat noise and flicker noise occurring in a circuit (not shown) for generating the first bias voltage VB1, for example, can be filtered. That is, heat noise and flicker noise superimposed on the voltage applied to the gate of the second transistor M2 can be reduced. Thus, fluctuations of the constant current I2 and the current Ir can be reduced, and thus minute fluctuations of the oscillating frequency of the VCO 5 can be reduced.

In the VCO 5, the resistive element R1 may be connected between the first transistor M1 and the ground VSS, and the resistive element R2 may be connected between the second transistor M2 and the power supply VDD (see FIG. 2). In general, flicker noise occurs when a current flows to a transistor, and such flicker noise may possibly cause minute fluctuations of the oscillating frequency of a VCO. By providing the resistive element R1, flicker noise of the first transistor M1 can be reduced. Similarly, by providing the resistive element R2, flicker noise of the second transistor M2 can be reduced. While both resistive elements R1 and R2 are provided in FIG. 2, either one of them may be provided. Also, when the resistive element R2 is provided for the configuration having the bias circuit 55 as shown in FIG. 2, it is desirable to connect the resistive elements R3 and R4 at positions corresponding to the resistive element R2 (between the power supply VDD and the transistors M5 and M8, respectively).

Figure 8:
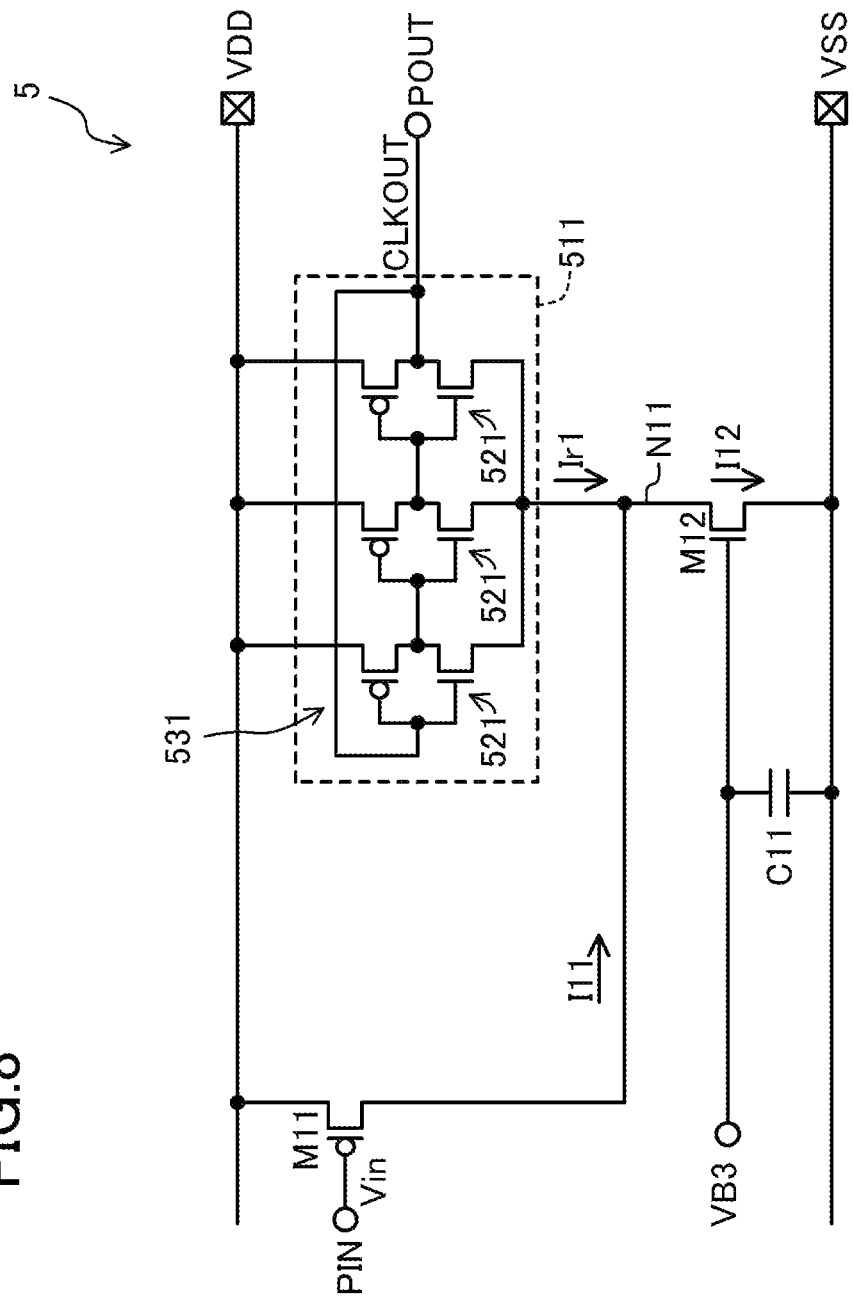
FIG. 8 is a view showing yet another circuit configuration example of the VCO of the embodiment.

In the drawings shown in the above embodiment, the conductivity types of transistors and the polarities of power supplies may be inverted. FIG. 8 shows an example in which the conductivity types of the transistors and the polarities of the power supplies are inverted from those in FIG. 4. In the configuration of FIG. 8, a p-type (equivalent to the first conductivity type) transistor M11 corresponds to the first transistor M1 in FIG. 4, and an n-type (equivalent to the second conductivity type) transistor M12 corresponds to the second transistor M2 in FIG. 4. Also, a ring oscillator 511, inverters 521, and an inverter ring 531 in FIG. 8 respectively correspond to the ring oscillator 51, the inverters 52, and the inverter ring 53 in FIG. 4, and a capacitive element C11 in FIG. 8 corresponds to the capacitive element C1 in FIG. 4. In the configuration of FIG. 8, also, the basic operation is similar to that in FIG. 4, and thus detailed description thereof is omitted here. For the configurations other than that of FIG. 4 (e.g., those of FIGS. 2, 3, 5, and 6), also, the conductivity types of transistors and the polarities of power supplies can be inverted as in the case described above, and similar effects can be obtained.

Figure 7:
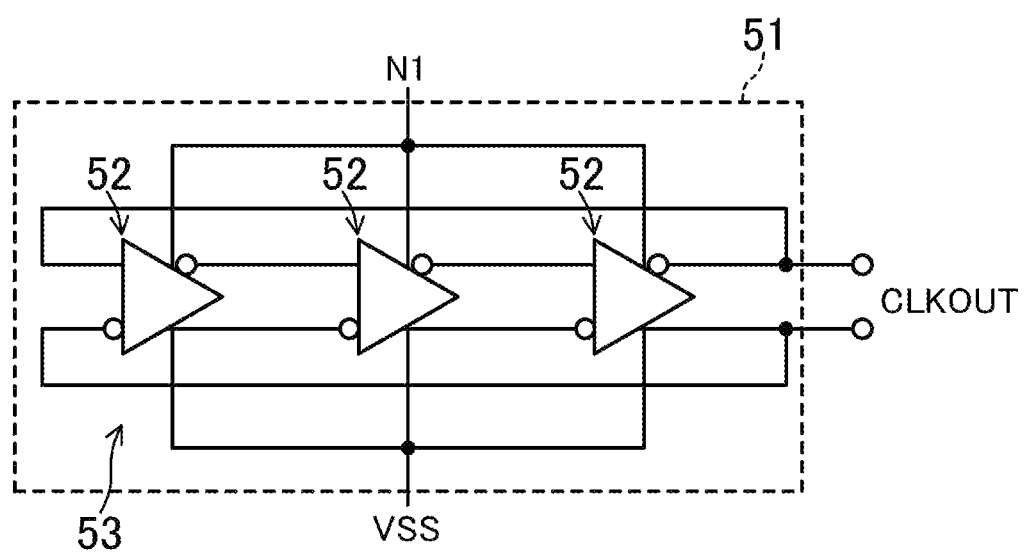
FIG. 7 is a view showing another circuit configuration example of a ring oscillator.

In the above embodiment, the inverters 52 constituting the inverter ring 53 of the ring oscillator 51 are assumed to be single-end inverters. Alternatively, as shown in FIG. 7, differential inverters 52 may be used for the inverter ring 53, for example. In this case, also, similar effects are obtained. The specific internal configuration of the inverters is not particularly limited, but conventionally known circuits having various configurations can be used.

While the above embodiment has been described assuming that the number of stages of inverters 52 constituting the inverter ring 53 is three, it may be five or more, for example. This also applies to the case of using the differential inverters 52. For example, the inverter ring 53 may be constituted by two or more inverters 52. Note that, in the case of using even-numbered stages of differential inverters 52 for the inverter ring 53, the output of the final-stage inverter 52 is to be connected to the opposite-polarity input terminal of the initial-stage inverter 52 although specific illustration is omitted.

While the above embodiment has been described assuming that the ring oscillator 51 is constituted by the inverter ring 53 having a plurality of inverters 52 connected in series, it is not limited to this. For example, at least some (some or all) of the plurality of inverters 52 may be constituted by a NAND circuit. Alternatively, a current mode logic (CML) circuit may be used for the inverters 52 constituting the ring oscillator 51.

The embodiment and alterations thereof described above can be combined to provide another embodiment. For example, in the configuration of FIG. 4, the resistive element R5 shown in FIG. 6 may be connected to the first bias voltage VB1. In this case, also, similar effects are obtained.

According to the present disclosure, a voltage-controlled oscillator (VCO) capable of stable and high-speed oscillation can be provided. The present disclosure is therefore useful for improvement of the performance such as speedup of an LSI, for example.

What is claimed is:

1. A voltage-controlled oscillator configured to output, from an output terminal, an oscillating signal responsive to an input voltage received at an input terminal, comprising:
 a first transistor of a first conductivity type with its gate connected to the input terminal, its source connected to a first power supply, and its drain connected to a first node;
 a second transistor of a second conductivity type different in conductivity type from the first conductivity type, with its gate connected to a first bias voltage, its source connected to a second power supply different in potential from the first power supply, and its drain connected to the first node;
 an inverter ring constituted by a plurality of stages of inverters connected in series;
 a capacitive element connected between the second power supply and the gate of the second transistor; and
 a cascode transistor provided at the first node, with its gate connected to a second bias voltage responsive to the first bias voltage,
wherein
 the inverter ring is connected between the first node and the first power supply, and an output of a final-stage inverter of the inverter ring is connected to the output terminal and to an input of an initial-stage inverter, and
 the drain of the first transistor is connected between the drain of the second transistor and a source of the cascode transistor.

2. The voltage-controlled oscillator of claim 1, wherein a first resistive element is connected between the first transistor and the first power supply.

3. The voltage-controlled oscillator of claim 1, wherein a second resistive element is connected between the second transistor and the second power supply.

4. The voltage-controlled oscillator of claim 1, wherein a third resistive element is connected between the second transistor and the first bias voltage.

5. The voltage-controlled oscillator of claim 2, wherein a third resistive element is connected between the second transistor and the first bias voltage.

6. The voltage-controlled oscillator of claim 3, wherein a third resistive element is connected between the second transistor and the first bias voltage.

7. A voltage-controlled oscillator configured to output, from an output terminal, an oscillating signal responsive to an input voltage received at an input terminal, comprising:
 a first transistor of a first conductivity type with its gate connected to the input terminal, its source connected to a first power supply, and its drain connected to a first node;
 a second transistor of a second conductivity type different in conductivity type from the first conductivity type, with its gate connected to a first bias voltage, its source connected to a second power supply different in potential from the first power supply, and its drain connected to the first node;
 an inverter ring constituted by a plurality of stages of inverters connected in series; and
 a cascode transistor provided at the first node, with its gate connected to a second bias voltage responsive to the first bias voltage,
wherein
 the inverter ring is connected between the first node and the first power supply, and an output of a final-stage inverter of the inverter ring is connected to the output terminal and to an input of an initial-stage inverter, and
 the drain of the first transistor is connected between the drain of the second transistor and a source of the cascode transistor.

8. The voltage-controlled oscillator of claim 7, wherein a first resistive element is connected between the first transistor and the first power supply.

9. The voltage-controlled oscillator of claim 7, wherein a second resistive element is connected between the second transistor and the second power supply.

10. The voltage-controlled oscillator of claim 1, wherein the plurality of stages of inverters included in the inverter ring are differential inverters.

11. A voltage-controlled oscillator configured to output, from an output terminal, an oscillating signal responsive to an input voltage received at an input terminal, comprising:
 a first transistor of a first conductivity type with its gate connected to the input terminal, its source connected to a first power supply, and its drain connected to a first node;
 a second transistor of a second conductivity type different in conductivity type from the first conductivity type, with its gate connected to a first bias voltage, its source connected to a second power supply different in potential from the first power supply, and its drain connected to the first node;
 a current drive-type ring oscillator provided between the first node and the first power supply, configured to output the oscillating signal from the output terminal; and
 a cascode transistor provided at the first node, with its gate connected to a second bias voltage responsive to the first bias voltage,
wherein
 the drain of the first transistor is connected between the drain of the second transistor and a source of the cascode transistor.

12. The voltage-controlled oscillator of claim 11, wherein
the ring oscillator includes an inverter ring constituted by
a plurality of stages of inverters connected in series, and
the inverter ring is connected between the first node and the first power supply, and an output of a final-stage inverter of the inverter ring is connected to the output terminal and to an input of an initial-stage inverter.

13. A PLL circuit comprising:
a phase comparator that compares phases of an external clock signal received from outside and a feedback clock signal;
a charge pump that, receiving a phase comparison result from the phase comparator, performs charge pumping;
a loop filter that converts an output of the charge pump to a control voltage;
the voltage-controlled oscillator of claim 1 that receives the control voltage as the input voltage and outputs the oscillating signal responsive to the control voltage; and
a frequency divider that divides the oscillating signal output from the voltage-controlled oscillator and outputs the result as the feedback clock signal.

14. A PLL circuit comprising:
a phase comparator that compares phases of an external clock signal received from outside and a feedback clock signal;
a charge pump that, receiving a phase comparison result from the phase comparator, performs charge pumping;
a loop filter that converts an output of the charge pump to a control voltage;
the voltage-controlled oscillator of claim 7 that receives the control voltage as the input voltage and outputs the oscillating signal responsive to the control voltage; and
a frequency divider that divides the oscillating signal output from the voltage-controlled oscillator and outputs the result as the feedback clock signal.

15. A PLL circuit comprising:
a phase comparator that compares phases of an external clock signal received from outside and a feedback clock signal;
a charge pump that, receiving a phase comparison result from the phase comparator, performs charge pumping;
a loop filter that converts an output of the charge pump to a control voltage;
the voltage-controlled oscillator of claim 11 that receives the control voltage as the input voltage and outputs the oscillating signal responsive to the control voltage; and
a frequency divider that divides the oscillating signal output from the voltage-controlled oscillator and outputs the result as the feedback clock signal.

* * * * *